United States Patent
Qiu et al.

(10) Patent No.: US 10,952,295 B2
(45) Date of Patent: Mar. 16, 2021

(54) USER CONTROL MODALITY FOR LED COLOR TUNING

(71) Applicant: Lumileds Holding B.V., Schipol (NL)

(72) Inventors: Yifeng Qiu, San Jose, CA (US); Johannes Willem Herman Sillevis Smitt, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/457,130

(22) Filed: Jun. 28, 2019

(65) Prior Publication Data

US 2020/0367331 A1    Nov. 19, 2020

Related U.S. Application Data

(60) Provisional application No. 62/849,229, filed on May 17, 2019.

(51) Int. Cl.
  *H05B 45/20*    (2020.01)
  *H05B 39/08*    (2006.01)
  *H05B 45/10*    (2020.01)

(52) U.S. Cl.
  CPC .......... *H05B 45/20* (2020.01); *H05B 39/083* (2013.01); *H05B 45/10* (2020.01)

(58) Field of Classification Search
  CPC ....... H05B 45/10; H05B 45/20; H05B 39/083
  See application file for complete search history.

(56) References Cited

U.S. PATENT DOCUMENTS

| | | |
|---|---|---|
| 3,247,174 A | 4/1966 | Breitenbach et al. |
| 8,729,812 B2 | 5/2014 | Kuwu |
| 9,131,581 B1 | 9/2015 | Hsia et al. |
| 9,730,291 B1 | 8/2017 | Janik et al. |
| (Continued) | | |

FOREIGN PATENT DOCUMENTS

| | | |
|---|---|---|
| DE | 112013006888 T5 | 12/2015 |
| EP | 3247174 A1 | 11/2017 |
| WO | WO-2017/131706 A1 | 8/2017 |

OTHER PUBLICATIONS

"U.S. Appl. No. 16/454,730, Notice of Allowance dated Jan. 8, 2020", 9 pgs.

(Continued)

*Primary Examiner* — Seokjin Kim
(74) *Attorney, Agent, or Firm* — Schwegman Lundberg & Woessner, P.A.

(57) ABSTRACT

Various embodiments include apparatuses and methods enabling a control apparatus for color tuning a light-emitting diode (LED) array. In one example, a controllable-lighting apparatus includes an LED array having at least one desaturated red LED, at least one desaturated green LED, and at least one desaturated blue LED. A number of color-tuning and luminous-flux control devices includes an adjustable correlated color temperature (CCT)-control device for setting a desired color temperature of the LED array, an adjustable $D_{uv}$-control device for setting a desired overall color cast of the LED array along an isothermal CCT line corresponding to the desired color temperature, and an adjustable flux-control device for setting a desired luminous-flux value of the LED array. Other apparatuses and methods are described.

20 Claims, 9 Drawing Sheets

(56) References Cited

U.S. PATENT DOCUMENTS

| | | |
|---|---|---|
| 9,801,250 B1 | 10/2017 | Halliwell |
| 10,155,395 B2 | 12/2018 | Hara et al. |
| 10,517,156 B1 | 12/2019 | Qiu et al. |
| 10,555,395 B1 | 2/2020 | Qiu |
| 10,652,962 B1 | 5/2020 | Qiu |
| 2007/0279440 A1 | 12/2007 | Negley |
| 2010/0072903 A1 | 3/2010 | Blaut et al. |
| 2010/0079088 A1 | 4/2010 | Lipcsei et al. |
| 2010/0109564 A1 | 5/2010 | Shin et al. |
| 2011/0115407 A1 | 5/2011 | Wibben et al. |
| 2013/0119872 A1 | 5/2013 | Chobot |
| 2014/0265919 A1 | 9/2014 | Pope et al. |
| 2014/0333216 A1 | 11/2014 | Zhang et al. |
| 2015/0237700 A1 | 8/2015 | Woytowitz |
| 2015/0351191 A1 | 12/2015 | Pope et al. |
| 2017/0127489 A1 | 5/2017 | Zulim et al. |
| 2017/0202071 A1* | 7/2017 | Chen ............... H05B 45/22 |
| 2017/0245338 A1 | 8/2017 | Turunen |
| 2017/0249755 A1 | 8/2017 | Shih |
| 2017/0374718 A1 | 12/2017 | Fang et al. |
| 2018/0146527 A1 | 5/2018 | Yadav et al. |
| 2019/0012511 A1* | 1/2019 | Weaver ............ G03B 15/05 |
| 2019/0116641 A1 | 4/2019 | Wilson et al. |

OTHER PUBLICATIONS

"U.S. Appl. No. 16/454,730, Notice of Allowance dated Nov. 1, 2019", 11 pgs.

"U.S. Appl. No. 16/454,730, Supplemental Notice of Allowability dated Feb. 5, 2020", 2 pgs.

"European Application Serial No. 19205102.7, extended European Search Report dated Dec. 12, 2019", 7 pgs.

"U.S. Appl. No. 16/403,265, Notice of Allowance dated Sep. 27, 2019", 10 pgs.

"U.S. Appl. No. 16/454,730, Supplemental Notice of Allowability dated Apr. 14, 2020", 2 pgs.

"U.S. Appl. No. 16/726,125, Non-Final Office Action dated Apr. 16, 2020", 11 pgs.

"U.S. Appl. No. 16/844,923, Preliminary Amendment filed Jun. 17, 2020", 8 pgs.

"European Application No. 19204908.8, extended European Search Report dated Apr. 8, 2020", 9 pgs.

U.S. Appl. No. 16/726,125, filed Dec. 23, 2019, Selecting Parameters in a Color-Tuning Application.

U.S. Appl. No. 16/844,923, filed Apr. 9, 2020, Dim-to-Warm LED Circuit.

"U.S. Appl. No. 16/726,125, Non-Final Office Action dated Jul. 20, 2020", 10 pgs.

"International Application Serial No. PCT/US2020/039137, International Search Report dated Sep. 29, 2020", 5 pgs.

"International Application Serial No. PCT/US2020/039137, Written Opinion dated Sep. 29, 2020", 10 pgs.

"U.S. Appl. No. 16/726,125, Response filed Oct. 20, 2020 to Non Final Office Action dated Jul. 20, 2020", 10 pgs.

"International Application Serial No. PCT/US2020/030485, International Search Report dated Jul. 16, 2020", 5 pgs.

"International Application Serial No. PCT/US2020/030485, Written Opinion dated Jul. 16, 2020", 9 pgs.

"International Application Serial No. PCT/US2020/032948, International Search Report dated Jul. 6, 2020", 3 pgs.

"International Application Serial No. PCT/US2020/032948, Written Opinion dated Jul. 6, 2020", 7 pgs.

"U.S. Appl. No. 16/844,923, Non-Final Office Action dated Dec. 24, 2020", 7 pgs.

\* cited by examiner

USER CONTROL MODALITY FOR LED COLOR TUNING

PRIORITY APPLICATION

This application claims priority to U.S. Provisional Application Ser. No. 62/849,229, filed on 17 May 2019, and entitled "A USER CONTROL MODALITY FOR ILLUMINATION BASED ON CCT, DUV, AND DIMMING," the disclosure of which is incorporated herein in its entirety by reference. This application is also related to Ser. No. 16/454,730, filed 27 Jun. 2019, and entitled "DIM-TO-WARM LED CIRCUIT," and Ser. No. 16/403,265, filed 3 May 2019, and entitled "SELECTING PARAMETERS IN A COLOR-TUNING APPLICATION."

TECHNICAL FIELD

The subject matter disclosed herein relates to color tuning of one or more light-emitting diodes (LEDs) or LED arrays that comprise a lamp operating substantially in the visible portion of the electromagnetic spectrum. More specifically, the disclosed subject matter relates to a technique to enable two color-tuning devices and a luminous-flux device to control two parameters of color temperature and a brightness level of the LED arrays.

BACKGROUND

Light-emitting diodes (LEDs) are commonly used in various lighting operations. The color appearance of an object is determined, in part, by the spectral power density (SPD) of light illuminating the object. For humans viewing an object, the SPD is the relative intensity for various wavelengths within the visible light spectrum. However, other factors can also affect color appearance. Also, both a correlated color temperature (CCT) of the LED, and a distance of the temperature of the LED on the CCT from a black-body line (BBL, also known as a black-body locus or a Planckian locus), can affect a human's perception of an object. In particular there is a large market demand for LED lighting solutions, such as in retail and hospitality lighting applications, where it is desirable to control both a color temperature and a brightness level of the LEDs.

There are presently two major technologies for color tuning (e.g., white tuning) of LEDs. A first technology is based on white LEDs of two or more CCTs. The second technology is based on a combination of Red/Green/Blue/Amber colors. The first technology simply does not have a capability to tune LEDs in the $D_{uv}$ direction. In the second technology, the color tuning capability is seldom offered as an available function. In those cases, the user is instead usually offered a color wheel based on either Red-Green-Blue (RGB) or Hue-Saturation-Lightness (HSL) models. However, the RGB and HSL models were not designed for general illumination. Both the RGB and HSL model are more appropriate for graphics or photographic applications.

The information described in this section is provided to offer the skilled artisan a context for the following disclosed subject matter and should not be considered as admitted prior art.

DETAILED DESCRIPTION

Figure 1:
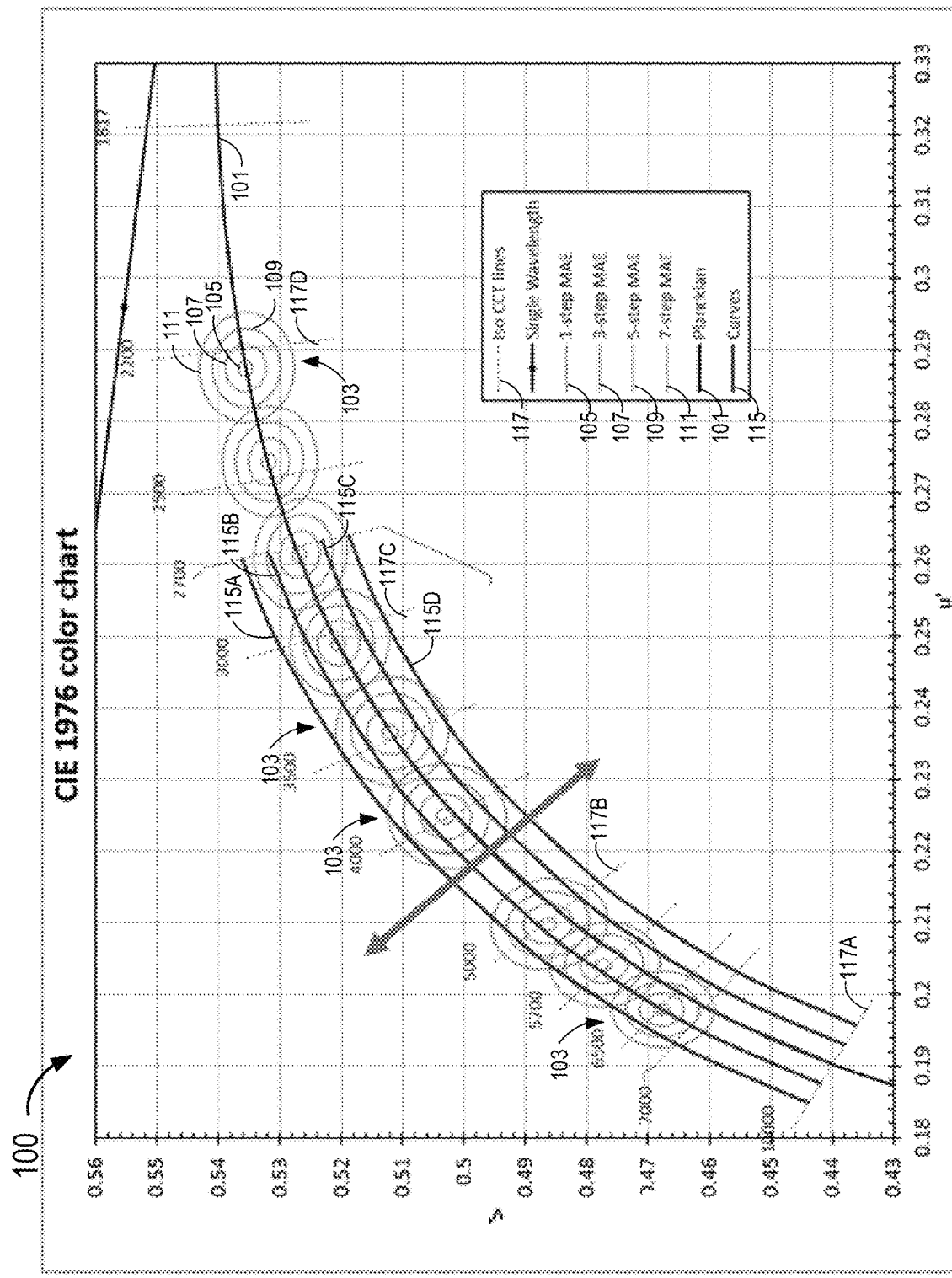
FIG. 1 shows a portion of an International Commission on Illumination (CIE) color chart, including a black body line (BBL)

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

Examples of different light illumination systems and/or light-emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer generally to like elements throughout.

Further, it will be understood that, although the terms first, second, third, etc. may be used herein to describe various elements. However, these elements should not be limited by these terms. These terms may be used to distinguish one element from another. For example, a first element may be termed a second element and a second element may be termed a first element without departing from the scope of the disclosed subject matter. As used herein, the term "and/or" may include any and all combinations of one or more of the associated listed items.

It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper," "lower," "horizontal," or "vertical" may be used herein to describe a relationship of one element, zone, or region relative to another element, zone, or region as illustrated in the figures. It will be understood that these terms are intended to encompass different orientations of the device in addition to an orientation depicted in the figures. Further, whether the LEDs, LED arrays, electrical components and/or electronic components are housed on one, two, or more electronics boards may also depend on design constraints and/or a specific application.

Semiconductor-based light-emitting devices or optical power-emitting-devices, such as devices that emit ultraviolet (UV) or infrared (IR) optical power, are among the most efficient light sources currently available. These devices may include light-emitting diodes, resonant-cavity light emitting diodes, vertical-cavity laser diodes, edge-emitting lasers, or the like (simply referred to herein as LEDs). Due to their compact size and low power requirements, LEDs may be attractive candidates for many different applications. For example, they may be used as light sources (e.g., flash lights and camera flashes) for hand-held battery-powered devices, such as cameras and cellular phones. LEDs may also be used, for example, for automotive lighting, heads-up display (HUD) lighting, horticultural lighting, street lighting, a torch for video, general illumination (e.g., home, shop, office and studio lighting, theater/stage lighting, and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where enhanced brightness is desired or required.

In various environments where LED-based lamps (or related illumination devices) are used to illuminate objects as well as for general lighting, it may be desirable to control aspects of the color temperature of the LED-based lamps (or a single lamp) in addition to a relative brightness (e.g., luminous flux) of the lamps. Such environments may include, for example, retail locations as well as hospitality locations such as restaurants and the like. In addition to the CCT, another lamp metric is the color-rendering index (CRI) of the lamp. The CRI is defined by the International Commission on Illumination (CIE) and provides a quantitative measure of an ability of any light source (including LEDs) to accurately represent colors in various objects in comparison with an ideal, or natural-light source. The highest possible CRI value is 100. Another quantitative lamp metric is $D_{uv}$. The $D_{uv}$ is a metric defined in, for example, CIE 1960, to represent the distance of a color point to the BBL.

It is a positive value if the color point is above the BBL and a negative value if the color point is below the BBL. Color points above the BBL appear greenish in color and those below the BBL appear pinkish in color. The disclosed subject matter provides an apparatus to control both a color temperature (CCT and $D_{uv}$) as well as a brightness level of the lamp. As described herein, the color temperature is related to both CCT and $D_{uv}$ in color-tuning applications.

The disclosed subject matter is therefore directed to a color tuning (covering both CCT and $D_{uv}$) and luminous flux (e.g., "brightness level") scheme for driving various colors of LEDs including, for example, primary color (Red-Green-Blue or RGB) LEDs, or desaturated (pastel) RGB color LEDs, to make light of various color temperatures with a high color-rendering index (CRI) and high efficiency, specifically addressing color mixing using phosphor-converted color LEDs.

AS is known in the relevant art, the forward voltage of direct color LEDs decreases with increasing dominant wavelength. These LEDS can be driven with, for example, multichannel DC-to-DC converters. Advanced phosphor-converted color LEDs, targeting high efficacy and CRI, have been created providing for new possibilities for correlated color temperature (CCT) tuning applications. Some of the advanced color LEDs have desaturated color points and can be mixed to achieve white colors with 90+ CRI over a wide CCT range. Other LEDs having 80+ CRI implementations, or even 70+ CRI implementations, may also be used with the disclosed subject matter. These possibilities use LED circuits that realize, and increase or maximize, this potential. At the same time, the control circuits described herein are compatible with single-channel constant-current drivers to facilitate market adoption.

As is known to a person of ordinary skill in the art, since light output of an LED is proportional to an amount of current used to drive the LED, dimming an LED can be achieved by, for example, reducing the forward current transferred to the LED. In addition to or instead of changing an amount of current used to drive each of a number of individual LEDs, a controller box (described in detail with reference to FIG. 5, below) may rapidly switch selected ones of the LEDs between "on" and "off" states to achieve an appropriate level of dimming and color temperature for the selected lamp.

Generally, LED drive circuits are formed using either an analog-driver approach or a pulse-width modulation (PWM)-driver approach. In an analog driver approach, all colors are driven simultaneously. Each LED is driven independently by providing a different current for each LED. The analog driver results in a color shift and currently there is not a way to shift current three ways. Analog driving often results in certain colors of LEDs being driven into low current mode and other times, into very high current mode. Such a wide dynamic range imposes a challenge on sensing and control hardware.

In a PWM driver, each color is switched on, in sequence, at high speed. Each color is driven with the same current. The mixed color is controlled by changing the duty cycle of each color. That is, one color can be driven for twice as long as another color to add into the mixed color. As human vision is unable to perceive very fast changing colors, the light appears to have one single color.

For example, a first LED (of a first color) is driven periodically with a current for a predetermined amount of time, then a second LED (of a second color) is driven periodically with the same current for a predetermined amount of time, and then a third LED (of a third color) is driven periodically with the current for a predetermined amount of time. Each of the three predetermined amounts of time may be the same amount of time or different amounts of time. The mixed color is therefore controlled by changing the duty cycle of each color. For example, if you have an RGB LED and desire a specific output, red may be driven for a portion of the cycle, green for a different portion of the cycle, and blue is driven for yet another portion of the cycle based on the perception of the human eye. Instead of driving the red LED at a lower current, it is driven at the same current for a shorter time. This example demonstrates the downside of PWM with the LEDs being poorly utilized, therefore leading to an inefficient use of power. In some embodiments, the current is supplied from a voltage-controlled current source.

Another advantage of the disclosed subject matter over the prior art is that the desaturated RGB approach can create tunable light on and off the BBL, as well as on the BBL, for example, an isothermal CCT line (as described below) while maintaining a high CRI. Various other prior art systems, in comparison, utilize a CCT approach where tunable color-points fall on a straight line between two primary colors of LEDs (e.g., R-G, R-B, or G-B).

FIG. 1 shows a portion of an International Commission on Illumination (CIE) color chart 100, including a black body line (BBL) 101 (also referred to as a Planckian locus) that forms a basis for understanding various embodiments of the subject matter disclosed herein. The BBL 101 shows the chromaticity coordinates for blackbody radiators of varying temperatures. It is generally agreed that, in most illumination situations, light sources should have chromaticity coordinates that lie on or near the BBL 101. Various mathematical procedures known in the art are used to determine the "closest" blackbody radiator. As noted above, this common lamp specification parameter is called the correlated color temperature (CCT). A useful and complementary way to further describe the chromaticity is provided by the $D_{uv}$ value, which is an indication of the degree to which a lamp's chromaticity coordinate lies above the BBL 101 (a positive $D_{uv}$ value) or below the BBL 101 (a negative $D_{uv}$ value).

The portion of the color chart is shown to include a number of isothermal lines 117. Even though each of these lines is not on the BBL 101, any color point on the isothermal line 117 has a constant CCT. For example, a first isothermal line 117A has a CCT of 10,000 K, a second isothermal line 117B has a CCT of 5,000 K, a third isothermal line 117C has a CCT of 3,000 K, and a fourth isothermal line 117D has a CCT of 2,200 K.

With continuing reference to FIG. 1, the CIE color chart 100 also shows a number of ellipses that represent a Macadam Ellipse (MAE) 103, which is centered on the BBL 101 and extends one step 105, three steps 107, five steps 109, or seven steps 111 in distance from the BBL 101. The MAE is based on psychometric studies and defines a region on the CIE chromaticity diagram that contains all colors which are indistinguishable, to a typical observer, from a color at the center of the ellipse. Therefore, each of the MAE steps 105 to 111 (one step to seven steps) are seen to a typical observer as being substantially the same color as a color at the center of a respective one of the MAEs 103. A series of curves, 115A, 115B, 115C, and 115D, represent substantially equal distances from the BBL 101 and are related to $D_{uv}$ values of, for example, +0.006, +0.003, 0, −0.003 and −0.006, respectively.

Figure 2A:
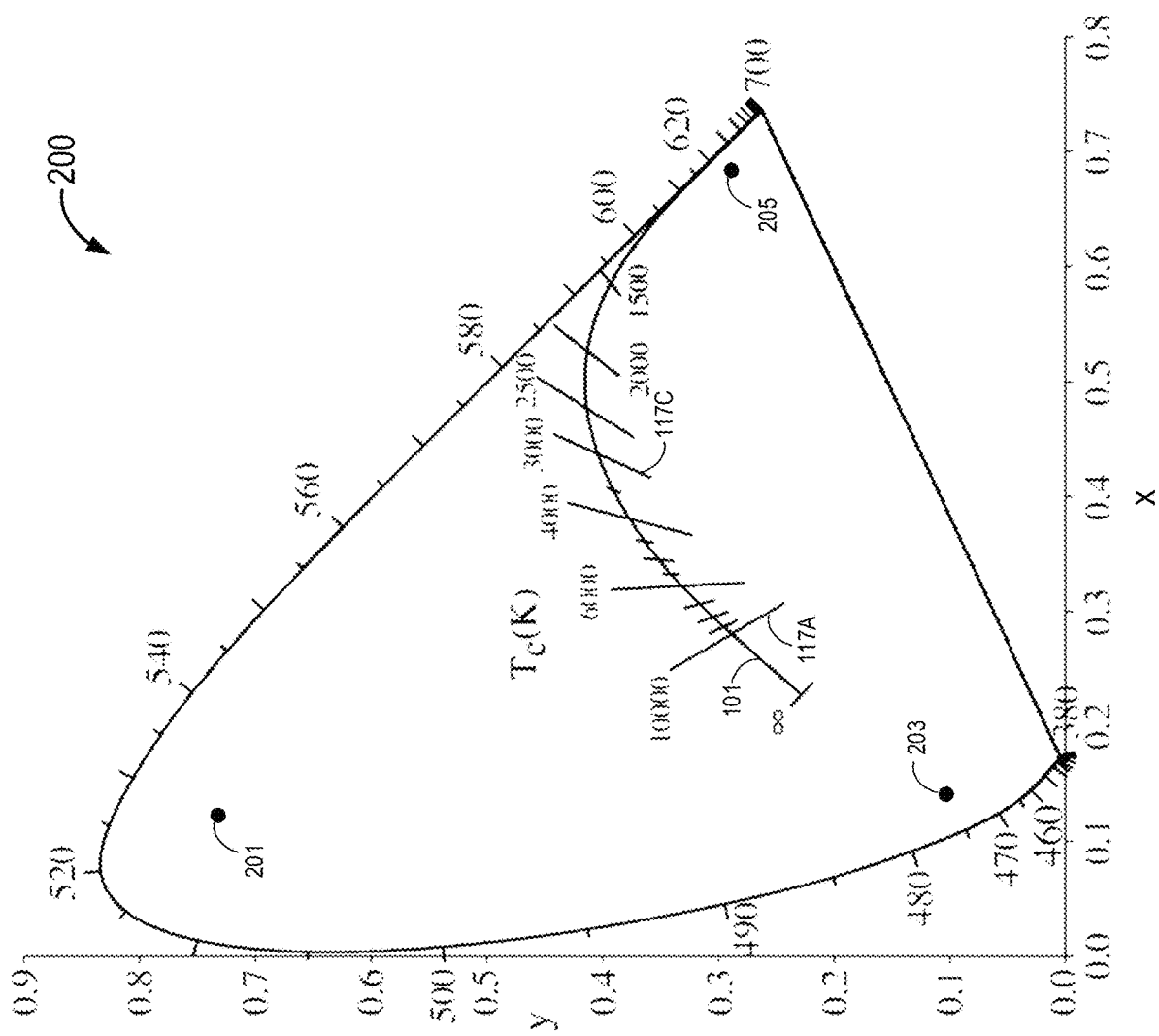
FIG. 2A shows a chromaticity diagram with approximate chromaticity coordinates of colors for typical red (R), green (G), and blue (B) LEDs, on the diagram, and including a BBL.

Referring now to FIG. 2A, and with continuing reference to FIG. 1, FIG. 2A shows a chromaticity diagram 200 with approximate chromaticity coordinates of colors for typical coordinate values (as noted on the x-y scale of the chromaticity diagram 200) for a red (R) LED at coordinate 205, a green (G) LED at coordinate 201, and a blue (B) LED at coordinate 203. FIG. 2A shows an example of the chromaticity diagram 200 for defining the wavelength spectrum of a visible light source, in accordance with some embodiments. The chromaticity diagram 200 of FIG. 2A is only one way of defining a wavelength spectrum of a visible light source; other suitable definitions are known in the art and can also be used with the various embodiments of the disclosed subject matter described herein.

A convenient way to specify a portion of the chromaticity diagram 200 is through a collection of equations in the x-y plane, where each equation has a locus of solutions that defines a line on the chromaticity diagram 200. The lines may intersect to specify a particular area, as described below in more detail with reference to FIG. 2B. As an alternative definition, the white light source can emit light that corresponds to light from a blackbody source operating at a given color temperature.

The chromaticity diagram 200 also shows the BBL 101 as described above with reference to FIG. 1. Each of the three LED coordinate locations 201, 203, 205 are the CCT coordinates for "fully-saturated" LEDs of the respective colors green, blue, and red. However, if a "white light" is created by combining certain proportions of the R, G, and B LEDs, the CRI of such a combination would be extremely low. Typically, in the environments described above, such as retail or hospitality settings, a CRI of about 90 or higher is desirable.

Figure 2B:
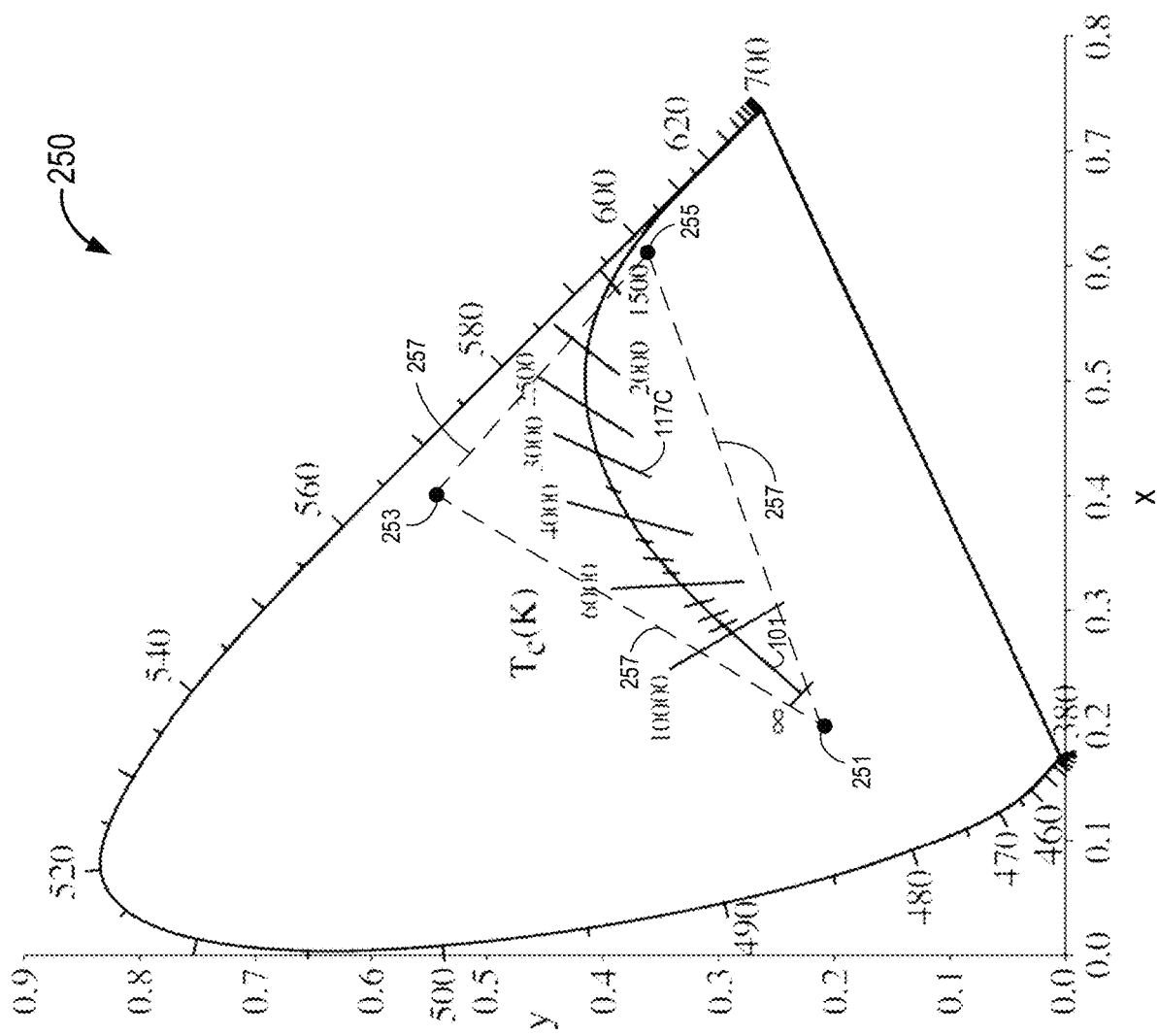
FIG. 2B shows a revised version of the chromaticity diagram of FIG. 2A, with approximate chromaticity coordinates for desaturated R, G, and B LEDs in proximity to the BBL, the desaturated R, G, and B LEDs having a color-rendering index (CRI) of approximately 90+ and within a defined color temperature range, in accordance with various embodiments of the disclosed subject matter.

FIG. 2B shows a revised version of the chromaticity diagram 200 of FIG. 2A, with approximate chromaticity coordinates for desaturated R, G, and B LEDs in proximity to the BBL, the desaturated R, G, and B LEDs having a color-rendering index (CRI) of approximately 90+ and within a defined color temperature range, in accordance with various embodiments of the disclosed subject matter.

However, the chromaticity diagram 250 of FIG. 2B shows approximate chromaticity coordinates for desaturated (pastel) R, G, and B LEDs in proximity to the BBL 101. Coordinate values (as noted on the x-y scale of the chromaticity diagram 250) are shown for a desaturated red (R) LED at coordinate 255, a desaturated green (G) LED at coordinate 253, and a desaturated blue (B) LED at coordinate 251. In various embodiments, a color temperature range of the desaturated R, G, and B LEDs may be in a range from about 1800 K to about 2500 K. In other embodiments, the desaturated R, G, and B LEDs may be in a color temperature range of, for example, about 2700 K to about 6500 K. In still other embodiments, the desaturated R, G, and B LEDs may be in a color temperature range of about 1800 K to about 7500 K. In still other embodiments, the desaturated R, G, and B LEDs may be selected to be in a wide range of color temperatures. As noted above, the color rendering index (CRI) of a light source does not indicate the apparent color of the light source; that information is given by the correlated color temperature (CCT). The CRI is therefore a quantitative measure of the ability of a light source to reveal the colors of various objects faithfully in comparison with an ideal or natural-light source.

In a specific exemplary embodiment, a triangle 257 formed between each of the coordinate values for the desaturated R, G, and B LEDs is also shown. The desaturated R, G, and B LEDs are formed (e.g., by a mixture of phosphors and/or a mixture of materials to form the LEDs as is known in the art) to have coordinate values in proximity to the BBL 101. Consequently, the coordinate locations of the respective desaturated R, G, and B LEDs, and as outlined by the triangle 257, has a CRI have approximately 90 or greater and an approximate tunable color-temperature-range of, for example, about 2700 K to about 6500 K. Therefore, the selection of a correlated color temperature (CCT) may be selected in the color-tuning application described herein such that all combinations of CCT selected all result in the lamp having a CRI of 90 or greater. Each of the desaturated R, G, and B LEDs may comprise a single LED or an array (or group) of LEDs, with each LED within the array or group having a desaturated color the same as or similar to the other LEDs within the array or group. A combination of the one or more desaturated R, G, and B LEDs comprises a lamp.

Figure 2C:
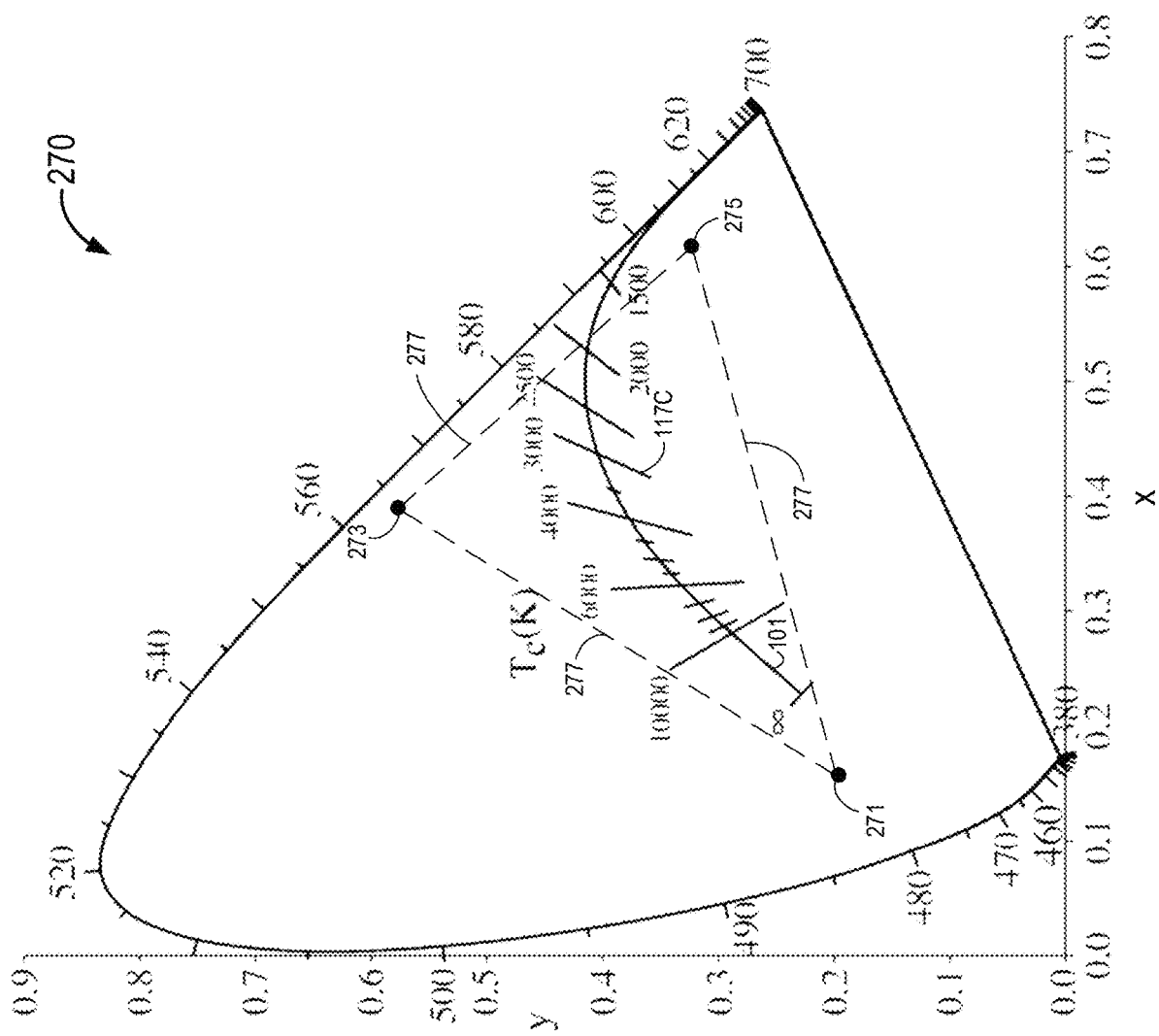
FIG. 2C shows a revised version of the chromaticity diagram of FIG. 2A, with approximate chromaticity coordinates for desaturated R, G, and B LEDs in proximity to the BBL, the desaturated R, G, and B LEDs having a color-rendering index (CRI) of approximately 80+ and within a defined color temperature range that is broader than the desaturated R, G, and B LEDs of FIG. 2B, in accordance with various embodiments of the disclosed subject matter.

FIG. 2C shows a revised version of the chromaticity diagram 200 of FIG. 2A, with approximate chromaticity coordinates for desaturated R, G, and B LEDs in proximity to the BBL, the desaturated R, G, and B LEDs having a color-rendering index (CRI) of approximately 80+ and within a defined color temperature range that is broader than the desaturated R, G, and B LEDs of FIG. 2B, in accordance with various embodiments of the disclosed subject matter.

However, the chromaticity diagram 270 of FIG. 2C shows approximate chromaticity coordinates for desaturated R, G, and B LEDs that are arranged farther from the BBL 101 than the desaturated R, G, and B LEDs of FIG. 2B. Coordinate values (as noted on the x-y scale of the chromaticity diagram 270) are shown for a desaturated red (R) LED at coordinate 275, a desaturated green (G) LED at coordinate 273, and a desaturated blue (B) LED at coordinate 271. In various embodiments, a color temperature range of the desaturated R, G, and B LEDs may be in a range from about 1800 K to about 2500 K. In other embodiments, the desaturated R, G, and B LEDs may be in a color temperature range of about 2700 K to about 6500 K. In still other embodiments, the desaturated R, G, and B LEDs may be in a color temperature range of about 1800 K to about 7500 K.

In a specific exemplary embodiment, a triangle 277 formed between each of the coordinate values for the desaturated R, G, and B LEDs is also shown. The desaturated R, G, and B LEDs are formed (e.g., by a mixture of phosphors and/or a mixture of materials to form the LEDs as is known in the art) to have coordinate values in proximity to the BBL 101. Consequently, the coordinate locations of the respective desaturated R, G, and B LEDs, and as outlined by the triangle 277, has a CRI have approximately 80 or greater and an approximate tunable color-temperature-range of, for example, about 1800 K to about 7500 K. Since the color temperature range is greater than the range shown in FIG. 2B, the CRI is commensurately decreased to about 80 or greater. However, a person of ordinary skill in the art will recognize that the desaturated R, G, and B LEDs may be produced to have individual color temperatures anywhere within the chromaticity diagram. Therefore, the selection of a correlated color temperature (CCT) may be selected in the color-tuning application described herein such that all combinations of CCT selected all result in the lamp having a CRI of 80 or greater. Each of the desaturated R, G, and B LEDs may comprise a single LED or an array (or group) of LEDs, with each LED within the array or group having a desaturated color the same as or similar to the other LEDs within the array or group. A combination of the one or more desaturated R, G, and B LEDs comprises a lamp.

Figure 3:
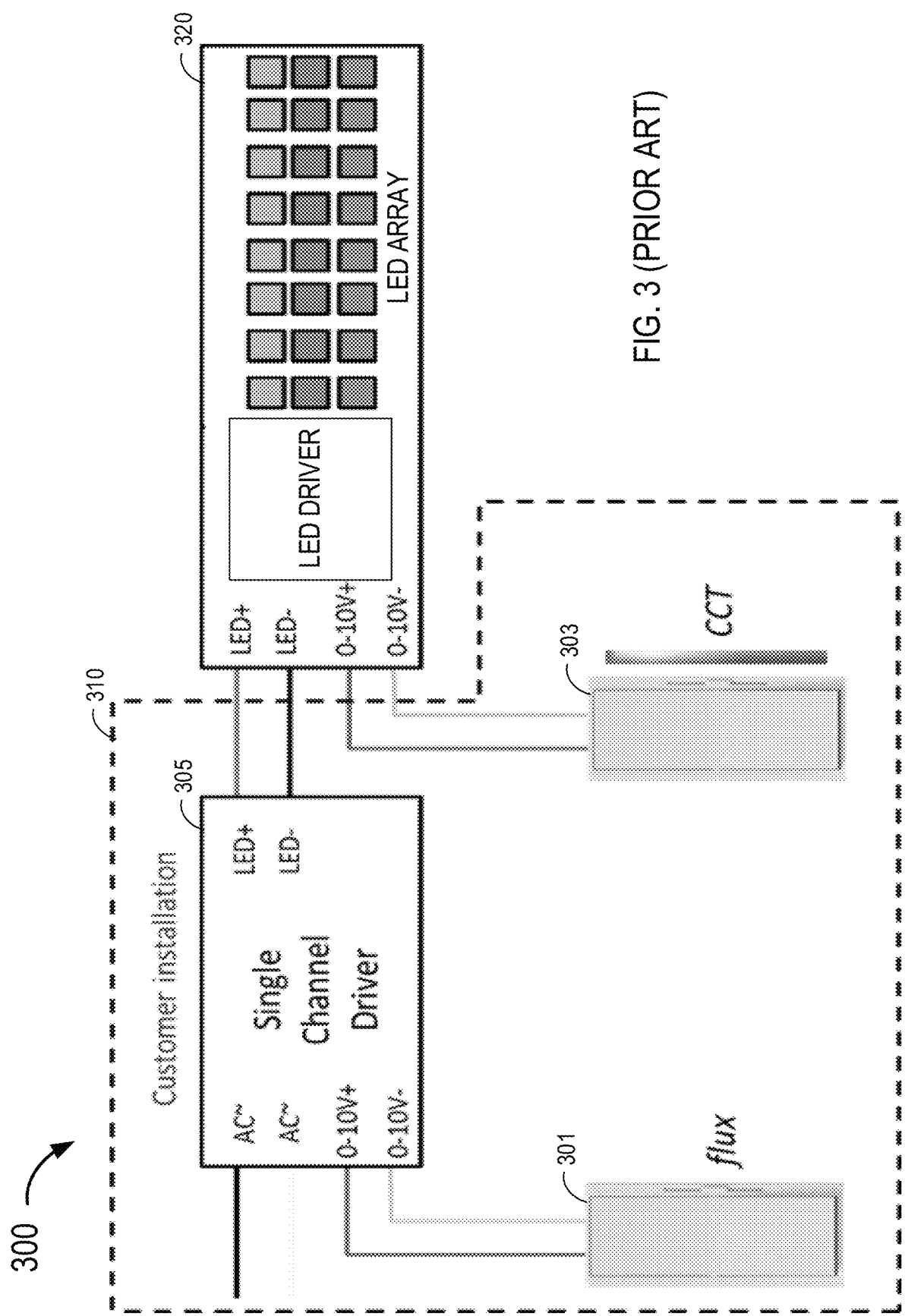
FIG. 3 shows a color-tuning device of the prior art requiring a separate flux control-device and a separate CCT control-device.

FIG. 3 shows a color-tuning device 300 of the prior art requiring a separate flux-control device 301 and a separate CCT-control device 303. The flux-control device 301 is coupled to a single-channel driver circuit 305 and the CCT-control device is coupled to a combination LED-driving circuit/LED array 320. The combination LED-driving circuit/LED array 320 may be a current-driver circuit, a PWM driver circuit, or a hybrid current-driver/PWM-driver circuit. Each of the flux-control device 301, the CCT-control device 303, and the single-channel driver circuit 305 is located in a customer facility 310 and all devices must be installed with applicable national and local rules governing high-voltage circuits. The combination LED-driving circuit/LED array 320 is generally located remotely from the customer facility 310. Consequently, both the initial purchase price and the installation price may be significant.

Figure 4:
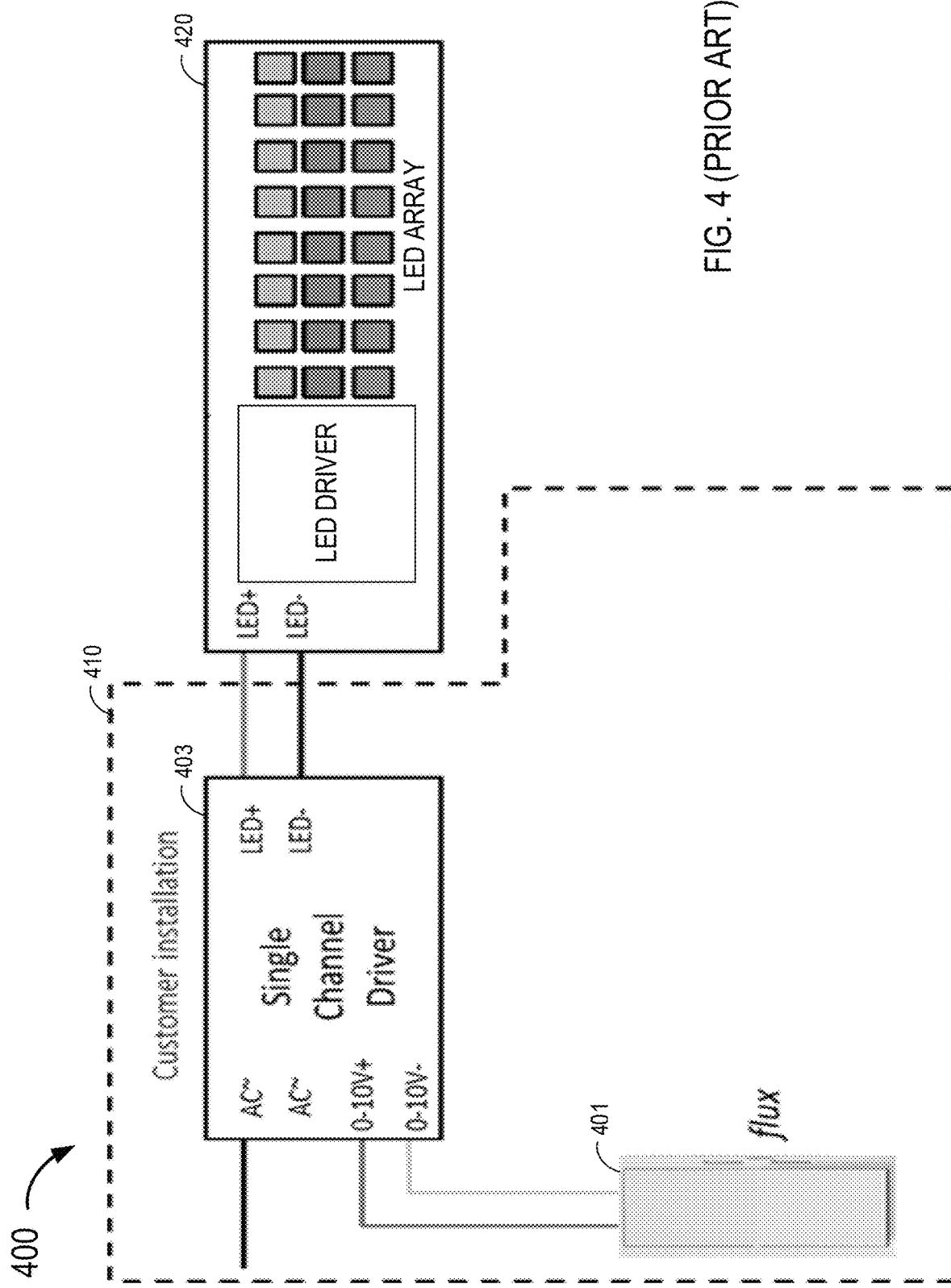
FIG. 4 shows another color-tuning device of the prior art using a single control-device that controls both color temperature and intensity of the LEDs.

FIG. 4 shows a color-tuning device 400 of the prior art that uses a single control-device 401. The single control-device 401 is coupled to a single-channel driver circuit 403, both of which are within a customer installation-area 410. The single-channel driver circuit 403 is coupled to a combination LED-driving circuit/LED array 420. The combination LED-driving circuit/LED array 420 is generally located remotely from the customer installation-area 410 (but generally still within a customer facility). The color-tuning device 400 uses a single device to control both luminous flux (and luminous intensity) and color temperature. As the luminous flux (intensity) of the LED array is decreased, the color temperature of the LED array is also reduced. Conversely, as the intensity of the LED array is increased, the color temperature of the LED array is also increased.

Figure 5:
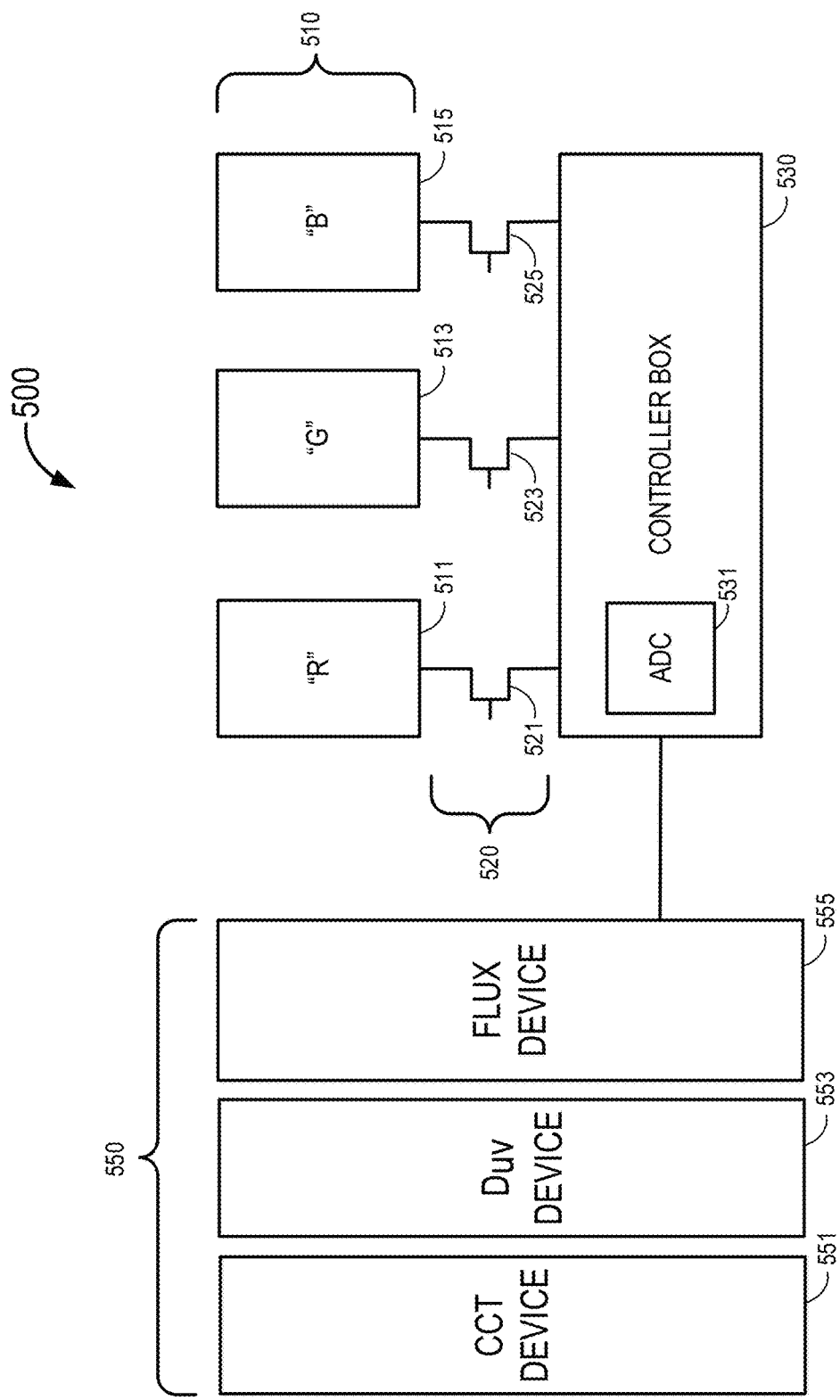
FIG. 5 shows an example of a high-level schematic diagram of the color-tuning and luminous-flux control devices, a controller box, and a desaturated LED array comprising, for example, the desaturated LEDs of FIGS. 2B and 2C, in accordance with various embodiments of the disclosed subject matter.

With reference now to FIG. 5, an example of a high-level schematic diagram 500 of the color-tuning and luminous-flux control devices 550, a controller box 530, a number of control switches 520 (e.g., a multiplexer array), and a desaturated LED array 510 comprising, for example, the desaturated LEDs of FIGS. 2B and 2C, in accordance with various embodiments of the disclosed subject matter, is shown. The LED array 510 is shown to include desaturated LEDs e.g., (an "R" LED 511, a "G" LED 513, and a "B" LED 515), although the high-level schematic diagram 500 is not necessarily limited to these colors only. Rather, these colors are presented for ease in understanding the various novel features of the disclosed subject matter. The "R" LED 511, the "G" LED 513, and the "B" LED 515 comprise the LED array 510 (e.g., a lamp). Also, each of the "R" LED 511, the "G" LED 513, and the "B" LED 515 may be comprised of one or more LEDs of the appropriate desaturated color (e.g., R, G, or B). Since the LED array 510 comprises, for example, the "R" LED 511, a "G" LED 513, and a "B" LED 515 colors, the LED array 510 may be considered to be a multi-colored LED array.

As is known to a person of ordinary skill in the art, since light output of an LED is proportional to an amount of current used to drive the LED, dimming an LED can be achieved by, for example, reducing the forward current transferred to the LED. The controller box 530 reads converted signals (e.g., from an analog signal to a digital signal through an analog-to-digital converter 531 (A/D converter or ADC)) transferred from the color-tuning and luminous-flux control devices 550 and send a pre-determined amount of current to one, two, or all three of the LEDs to change an overall CCT and/or $D_{uv}$ level of the LED array 510.

In addition to or instead of changing an amount of current used to drive each of individual ones of the "R" LED 511, the "G" LED 513, and the "B" LED 515, the controller box 530 may rapidly switch selected ones of the LEDs between "on" and "off" states to achieve an appropriate level of dimming for the selected lamp in accordance with intensities desired as indicated by an end-user in setting a level of desired brightness on the flux-control device 555. In embodiments, the controller box 530 may be a three-channel converter, known in the art. Upon reading and understanding the disclosed subject matter, a person of ordinary skill in the art will recognize that the individual LEDs comprising the LED array 510 may be controlled in other ways as well.

In accordance with various embodiments of the disclosed subject matter, the color-tuning and luminous-flux control devices 550 include three separate devices (although physically they may be grouped onto a single device) including a CCT-control device 551, a $D_{uv}$-control device 553, and a flux-control device 555. One or more of the three devices may comprise an electrical control-device, a mechanical control-device, or a software control-device (described in more detail with reference to FIG. 6). The control devices may be based on analog or digital signals. If one or more of the devices is based on an analog output, the controller box 530 includes the analog-to-digital converter (ADC) 531. In various embodiments, one or more of the control devices may comprise a voltage divider. In other embodiments, one or more of the control devices comprises various types of capacitively or resistively coupled current or voltage output devices known in the art. All three devices may comprise the same type of control device or various types of control devices.

For example, in one specific exemplary embodiment, one or more of the CCT-control device 551, the Dm-control device 553, and the flux-control device 555 may be a 0 volt to 10 volt dimmer device that is adapted to function as a one-dimensional control. As is known in the art, the 0-to-10 volt dimmer device is traditionally used for flux dimming. A position of, for example, a rotary or linear potentiometer or rheostat, can be used to output a signal within the 0-to-10 volt range, inclusively.

In other embodiments, each of the CCT-control device 551, the Dm-control device 553, and the flux-control device 555 can be of electrically-based or mechanically-based. The devices can be analog or digital. In some embodiments, the devices can be realized by physical knobs, dials, sliders, wheels, dipswitches, and/or or their various equivalents. In another embodiment, the CCT-control device 551, the Dm-control device 553, and the flux-control device 555 can be implemented as, for example, a resistive/capacitive touch panel and with or without an integrated display. This embodiment is described in more detail with reference to FIG. 6, below.

An algorithm may be used to accept the output signal (e.g., in analog or digital form) and translate the output signal to one of the three control signals. For example, the algorithm may correlate a 9.7 V output signal from the CCT-control device 551 to a color temperature for the LED array 510 of 6350 K. The controller box 530, described in more detail below, then sends signals to turn various ones of the control switches 520 "on" or "off" in rapid succession so that a human observer perceives the LED array 510 as emitting a color temperature of 6350 K (e.g., a mixture of primarily green light and blue light). Substantially concurrently, the algorithm may correlate a 4.0 V output signal from the $D_{uv}$-control device 553 to a negative value of $D_{uv}$ of −0.003, or slightly below the BBL 101 of FIG. 1, along the iso-CCT line of 6350 K to a slightly pinkish value as discussed above. Therefore, the controller box 530 again sends signals to turn various ones of the control switches 520 "on" or "off" in rapid succession so that a human observer perceives the LED array 510 as emitting a color temperature of 6350 K, but now with a slightly pinkish cast. Finally, the algorithm may correlate a 5.7 V output signal from the flux-control device 555 to an intensity level for the LED array 510 to have an intensity level of 57% of full brightness (in this example, 5.7 volts is received by the controller box 530 from a device having a maximum output voltage of 10 volts, or 5.7 V/10 V=57%). The controller box 530 then continues to send signals to turn the control switches 520 "on" and "off" to achieve the color temperature of 6350 K with a $D_{uv}$ adjustment of −0.003. However, now the total value of current sent to the LED array 510 is now at 57% of the maximum operating current that is available. In various embodiments, the algorithm determines each of the CCT-control device 551, the $D_{uv}$-control device 553, and the flux-control device 555 in a monotonic relationship (a one-to-one correspondence) with their respective algorithmic output values.

In other embodiments, an output signal may be correlated to a lookup table (LUT) to translate the output signal to one of the three control signals. In these embodiments, the controller box 530 may be used to accept and read the output signal (e.g., in analog or digital form) and translate the output signal to one of the three control signals. For example, the controller box 530 receives a 3.5 V output signal from the CCT-control device 551. The LUT indicates that the 3.5 V output signal corresponds to a color temperature for the LED array 510 of 3400 K. As noted above with reference to the algorithm embodiment, the controller box 530 then sends signals to turn various ones of the control switches 520 "on" or "off" in rapid succession so that a human observer perceives the LED array 510 as emitting a color temperature of 3400 K (e.g., a mixture of primarily green light and red light). Substantially concurrently with receiving and reading a value of the output signal from the CCT-control device 551, an output signal from the $D_{uv}$-control device 553 of, for example, 8.5 V may correlate to a positive value of $D_{uv}$ of +0.006 in the LUT. The correlated $D_{uv}$ value of +0.006 is slightly above the BBL 101 of FIG. 1, along the iso-CCT line of 3400 K now having a slightly greenish value as discussed above. Therefore, the controller box 530 again sends signals to turn various ones of the control switches 520 "on" or "off" in rapid succession so that a human observer perceives the LED array 510 as emitting a color temperature of 3400 K, but now with a slightly greenish cast. Finally, the LUT may correlate a 10.0 V output signal from the flux-control device 555 to an intensity level for the LED array 510 to have an intensity level of 100% of full brightness. Again, as described above with regard to the algorithm embodiments, the controller box 530 continues to send signals to turn the control switches 520 "on" and "off" to achieve the color temperature of 3400 K with a $D_{uv}$ adjustment of +0.006. However, now the total value of current sent to the LED array 510 is now at 100% of the maximum operating current available. In various embodiments, the lookup table is arranged to determine each of the CCT-control device 551, the $D_{uv}$-control device 553, and the flux-control device 555 in a monotonic relationship (a one-to-one correspondence) with their respective LUT output values.

Therefore, in the LUT embodiment, each of the signals received and read from the CCT-control device 551, the Dm-control device 553, and the flux-control device 555 function in a similar manner as described above with reference to the algorithm embodiments. The difference being that, rather than applying the received voltage signal to an algorithm, the lookup table embodiment receives the voltage signal, and then consults a LUT for a corresponding CCT color temperature, $D_{uv}$ value, or dimming value with which to drive individual ones of the R" LED 511, the "G" LED 513, and the "B" LED 515 in the LED array 510. In various embodiments, the algorithm embodiment and the LUT embodiment may be used concurrently. For example, output signals from the CCT-control device 551 and the $D_{uv}$-control device 553 may function and be correlated under the algorithm embodiment while out signals from the flux-control device 555 may function and be correlated under the LUT embodiment.

Each of the algorithm embodiments and the LUT embodiments may be performed with, for example, one or more microcontrollers (not shown) or other device types described below (e.g., hardware, firmware, and/or software devices). The various device types can be defined as modules. As noted above, the one or more microcontrollers of modules may be embedded within, for example, the controller box 530, or contained within each of the CCT-control device 551, the $D_{uv}$-control device 553, and the flux-control device 555, or within a microcontroller placed in proximity to the control devices (e.g., adjacent to an electrical box or in a separate box adjacent to the electrical box housing the control devices. a controller box 501 as described with reference to FIG. 5, below.

Additionally. some or all of these modules may be contained within the controller box 530. In some embodiments, the modules may also comprise software-based modules (e.g., code stored or otherwise embodied in a machine-readable medium or in a transmission medium), hardware modules, or any suitable combination thereof. A hardware module is a tangible (e.g., non-transitory) physical component (e.g., a set of one or more microcontrollers or microprocessors or other hardware-based devices) capable of performing certain operations and interpreting the output signals received from the color-tuning and luminous-flux control devices 550. The one or more modules may be configured or arranged in a certain physical manner. In various embodiments, one or more microcontrollers or microprocessors, or one or more hardware modules thereof, may be configured by software (e.g., an application or portion thereof) as a hardware module that operates to perform operations described herein for that module.

In some example embodiments, a hardware module may be implemented, for example, mechanically or electronically, or by any suitable combination thereof. For example, a hardware module may include dedicated circuitry or logic that is permanently configured to perform certain operations. A hardware module may be or include a special-purpose processor, such as a field-programmable gate array (FPGA) or an application specific integrated circuit (ASIC). A hardware module may also include programmable logic or circuitry that is temporarily configured by software to perform certain operations, such as an interpretation the output signals received from the color-tuning and luminous-flux control devices 550 to particular CCT, $D_{uv}$, or flux values, either through an algorithm or the LUT described above. As an example, a hardware module may include software encompassed within a CPU or other programmable processor. It will be appreciated that the decision to implement a hardware module mechanically, electrically, in dedicated and permanently configured circuitry, or in temporarily configured circuitry (e.g., configured by software) may be driven by cost and time considerations.

In various embodiments, the controller box 530 may comprise a hybrid LED driving-circuit for CCT and Du, tuning. The hybrid driving-circuit can include an LED driver to produce a stabilized LED-driver current. Consequently, the hybrid driving-circuit provides current to at least two of the "R" LED 511, the "G" LED 513, and the "B" LED 515 that comprise the LED array 510. In a specific exemplary embodiment, the control switches 520 delivers the current to the appropriate LEDs based on, for example, the desired CCT and $D_{uv}$ tuning. The hybrid driving-circuit within the controller box 530 may then be overlaid with PWM time-slicing directing current to at least two of the "R" LED 511, the "G" LED 513, and the "B" LED 515 that comprise the LED array 510.

In various embodiments, the controller box 530 and/or the microcontroller (or other modules) described above can be configured to have a special calibration mode. The calibration mode can function with either the algorithm (although the user may need access to the underlying software or firmware to change values) or values in the LUT. For example, the controller box 530 can enter the calibration mode if it is power cycled in a special sequence (e.g., a combination of long and short power-up/down cycles). While in this calibration mode, the user (e.g., a calibrating technician at the factory or an advanced end-user) is asked to change the correlation values of the output signals of the three control devices to their respective controlled-values (CCT, $D_{uv}$, and flux). The controller box 530 then stores these two algorithms or values in, for example, software in an internal memory or firmware (e.g., an EEPROM), or hardware (e.g., a Field Programmable Gate Array (FPGA)). The internal memory can take a number of forms including, for example, electrically erasable programmable read-only memory (EEPROM), phase-change memory (PCM), flash memory, or various other types of non-volatile memory devices known in the art.

Figure 6:
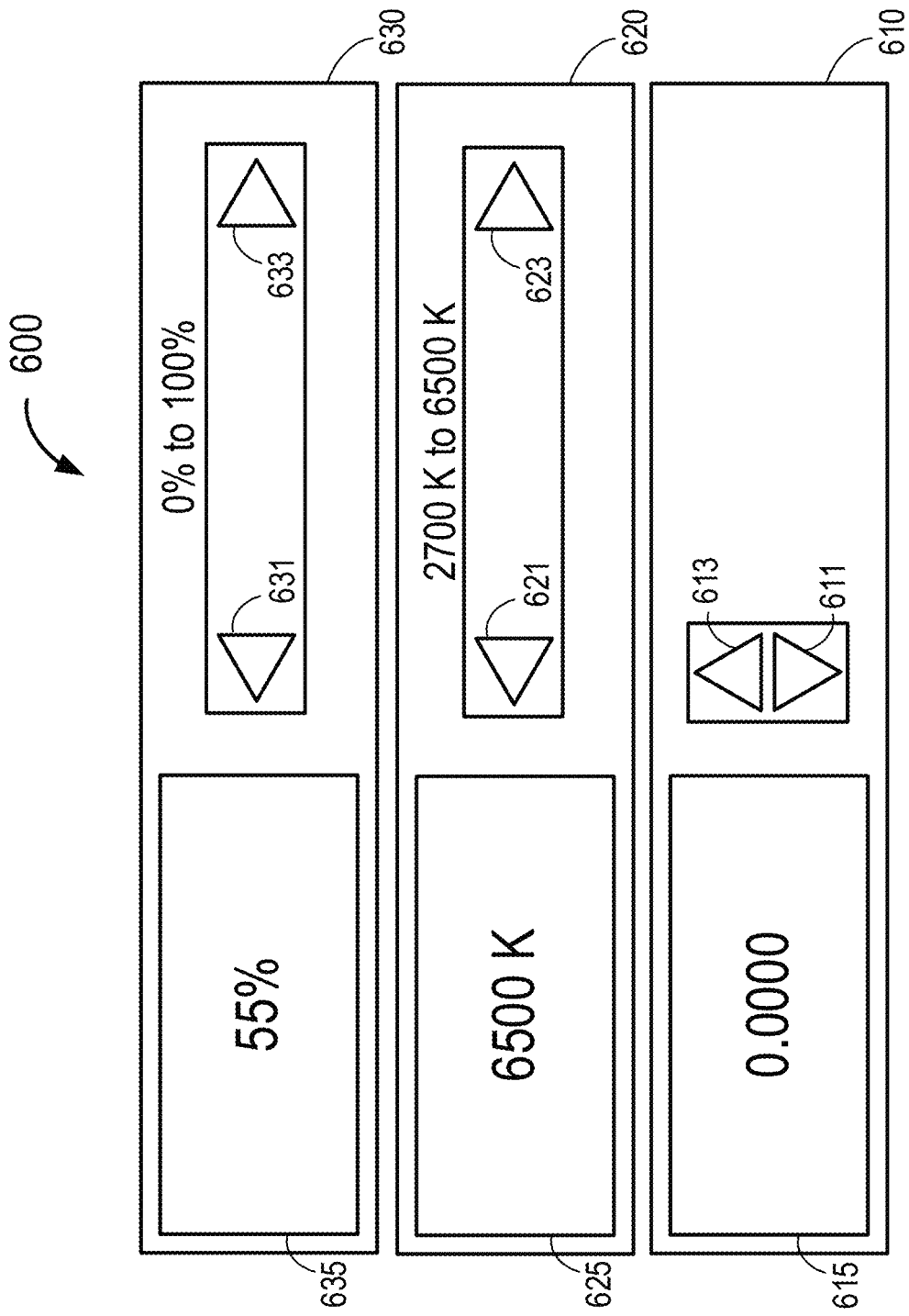
FIG. 6 shows an exemplary embodiment of the color-tuning and luminous-flux control devices of FIG. 5 implemented on a display screen, in accordance with various exemplary embodiments of the disclosed subject matter.

FIG. 6 shows an exemplary embodiment of the color-tuning and luminous-flux control devices 550 of FIG. 5 implemented on a display screen 600, in accordance with various exemplary embodiments of the disclosed subject matter. In this example, the display screen 600 shows a first channel 610 to control the $D_{uv}$ distance from the BBL (see, e.g., FIG. 1) of the LED array 510, a second channel 620 to control the CCT of the LED array 510, and a third channel 630 to control the luminous flux (intensity) of the LED array 510. Each of the channels may be separate portions of the same display screen 600 or may comprise three separate portions, which when combined, comprise the display screen 600.

The first channel 610 includes a first button 611 to lower the value of the $D_{uv}$ distance from the BBL and a second button 613 to increase the $D_{uv}$ distance from the BBL to control the $D_{uv}$ portion of the color-tuning of the LED array 510. The value chosen for $D_{uv}$ may then be displayed on a $D_{uv}$-display portion 615.

The second channel 620 includes a first button 621 to lower the value of the CCT and a second button 623 to increase the value of CCT chosen to control the CCT portion of the LED array 510. The value chosen for the CCT may then be displayed on a CCT-display portion 625 of the display screen 600.

The third channel 630 includes a first button 631 to lower the value of the luminous flux (intensity or brightness level of the LED array 510) and a second button 633 to increase the value of the luminous flux of the LED array 510. The value chosen for the luminous flux may then be displayed on a luminous-flux-display portion 635 of the display screen 600.

As will be understood by a person of ordinary skill in the art, in some embodiments, some or all of the buttons 611, 613, 621, 623, 631, 633 may comprise "soft buttons," implemented on, for example, a touch-sensitive version of the display screen 600. In other embodiments, some or all of the buttons 611, 613, 621, 623, 631, 633 may comprise hardware-implemented buttons (e.g., a momentary-contact switch or other type of hardware-based switch) formed in the display screen 600. In other embodiments, some or all of the buttons 611, 613, 621, 623, 631, 633 may comprise hardware-implemented buttons that are, for example, capacitively-based portions of the display screen 600. In still other embodiments, a combination of button types may be used.

Figure 7:
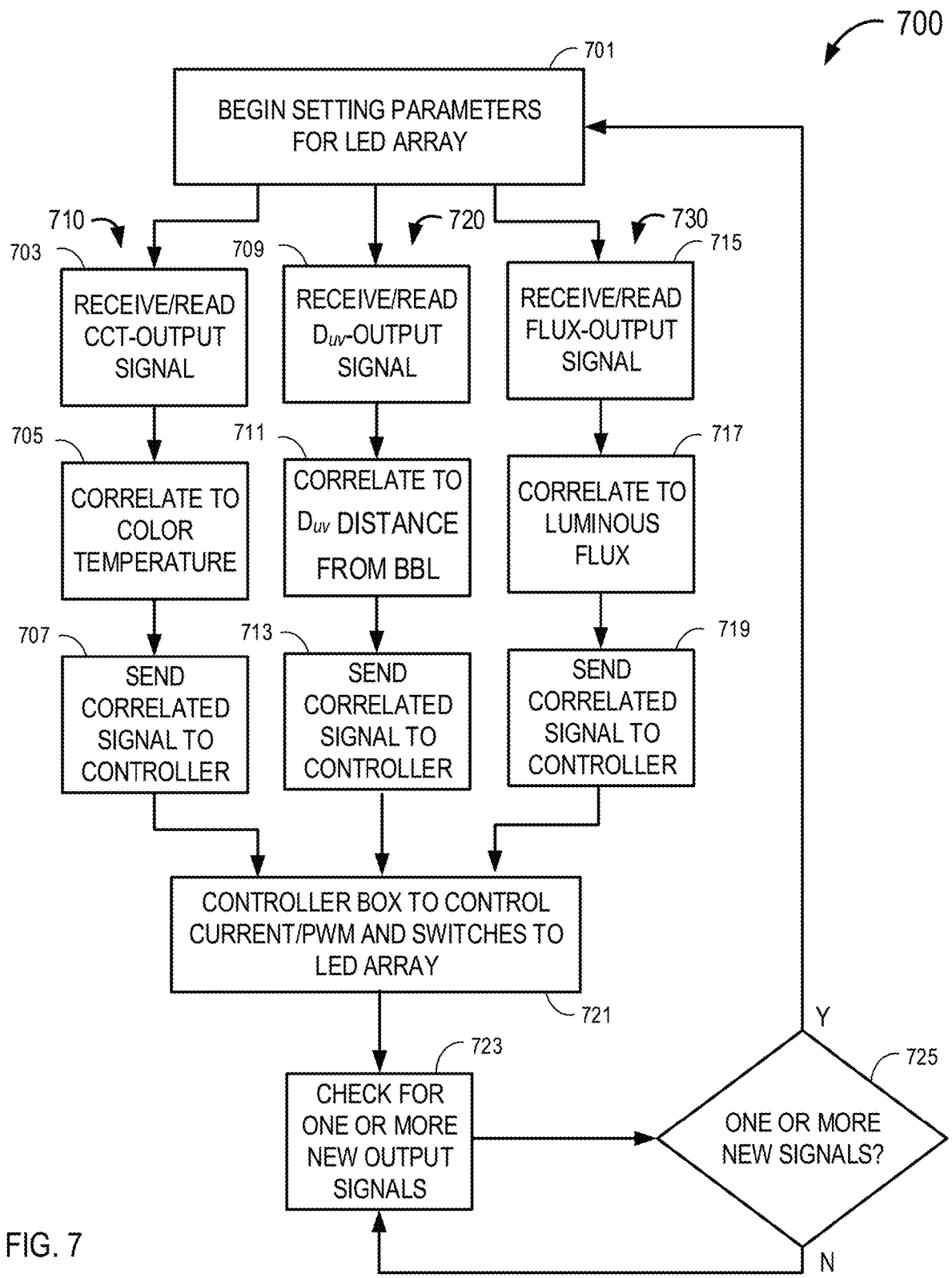
FIG. 7 shows an exemplary method to set the parameters of CCT, $D_{uv}$, and luminous flux for the LED array.

Referring now to FIG. 7, an exemplary method to set the parameters of CCT, $D_{uv}$, and luminous flux for the LED array 510 of FIG. 5 is shown. The method begins at operation 701, where the initial values of parameter settings (CCT, $D_{uv}$, and flux) are started (or updated, depending upon whether any values from the one or more of the CCT-control device 551, the $D_{uv}$-control device 553, and the flux-control device 555 have already been set). Each of the three parameters that can be set for the LED array 510 includes a separate branch. A CCT branch 710 receives and reads input signals related to setting the CCT for the LED array 510 and correlates the CCT signals to instructions for the controller box 530. A $D_{uv}$ branch 720 receives and reads input signals related to setting the $D_{uv}$ for the LED array 510 and correlates the $D_{uv}$ signals to instructions for the controller box 530. A flux branch 730 receives and reads input signals related to setting the flux for the LED array 510 and correlates the received flux signals to instructions for the controller box 530.

Referring now to the CCT branch 710, at operation 703, a CCT-output signal is received and read from, for example, the CCT-control device 551 (see FIG. 5) or the second channel 620 of the display screen 600 (see FIG. 6). At operation 705, the received CCT-output signal is correlated to a desired color temperature indicative of the setting from the CCT-control device 551 or the second channel 620. As described above, in one embodiment, the correlation may occur by providing a value of the CCT-output signal as an input to the CCT signal-to-color temperature algorithm. In another embodiment, the correlation may occur by providing a value of the CCT-output signal as an input to a lookup table. The correlated output value from the algorithm or the LUT is then sent as a signal (e.g., analog or digital) to the controller box 530, at operation 707. The signal is interpreted in the controller box 530, at operation 721, to send appropriate current levels and/or PWM signals, substantially simultaneously, to at least two of the three colors in the LED arrays 510 based on the received CCT-output signal.

With reference now to the $D_{uv}$ branch 720, at operation 709, a $D_{uv}$-output signal is received and read from, for example, the $D_{uv}$-control device 553 (see FIG. 5) or the first channel 610 of the display screen 600 (see FIG. 6). At operation 711, the received $D_{uv}$-output signal is correlated to a desired $D_{uv}$ value that is indicative of the setting from the $D_{uv}$-control device 553 or the first channel 610. As described above, in one embodiment, the correlation may occur by providing a value of the $D_{uv}$-output signal as an input to an algorithm structures to relate the $D_{uv}$ signal-to-$D_{uv}$ distance from the BBL. In another embodiment, the correlation may occur by providing a value of the $D_{uv}$-output signal as an input to a lookup table. The correlated output value from the algorithm or the LUT is then sent as a signal (e.g., analog or digital) to the controller box 530, at operation 713. The signal is interpreted in the controller box 530, at operation 721, to send appropriate current levels and/or PWM signals, substantially simultaneously, to at least two of the three colors in the LED arrays 510 based on the received $D_{uv}$-output signal.

In the flux branch 730 of the method 700, at operation 715, a flux-output signal is received and read from, for example, the flux-control device 565 (see FIG. 5) or the third channel 630 of the display screen 600 (see FIG. 6). At operation 717, the received flux-output signal is correlated to a desired luminous-flux level indicative of the setting from the flux-control device 565 or the third channel 630. In one embodiment, the correlation may occur by providing a value of the flux-output signal as an input to the luminous-flux signal-to-flux intensity algorithm. In another embodiment, the correlation may occur by providing a value of the flux-output signal as an input to a lookup table. The correlated output value from the algorithm or the LUT is then sent as a signal (e.g., analog or digital) to the controller box 530, at operation 719. The signal is interpreted in the controller box 530, at operation 721, to send appropriate current levels and/or PWM signals, substantially simultaneously, to at least two of the three colors in the LED arrays 510 based on the received flux-output signal.

At operation 723, the method checks (e.g., polls) for any new/revised signals from the color-tuning and luminous-flux control devices 550 or the display screen 600. If one or more new signals is sensed at operation 725, the method starts again at operation 701.

Upon reading and understanding the disclosed subject matter, a person of ordinary skill in the art will recognize that the method may be applied to traditional RGB colors of LEDs or to desaturated RGB colors of LEDs. The skilled artisan will also recognize that additional or fewer colors of LEDs can be used.

In various embodiments, many of the components described may comprise one or more modules configured to implement the functions disclosed herein. In some embodiments, the modules may constitute software modules (e.g., code stored on or otherwise embodied in a machine-readable medium or in a transmission medium), hardware modules, or any suitable combination thereof. A "hardware module" is a tangible (e.g., non-transitory) physical component (e.g., a set of one or more microprocessors or other hardware-based devices) capable of performing certain operations and interpreting certain signals. The one or more modules may be configured or arranged in a certain physical manner. In various embodiments, one or more microprocessors or one or more hardware modules thereof may be configured by software (e.g., an application or portion thereof) as a hardware module that operates to perform operations described herein for that module.

In some example embodiments, a hardware module may be implemented, for example, mechanically or electronically, or by any suitable combination thereof. For example, a hardware module may include dedicated circuitry or logic that is permanently configured to perform certain operations. A hardware module may be or include a special-purpose processor, such as a field-programmable gate array (FPGA) or an application specific integrated circuit (ASIC). A hardware module may also include programmable logic or circuitry that is temporarily configured by software to perform certain operations, such as interpretation of the various states and transitions within the finite-state machine. As an example, a hardware module may include software encompassed within a CPU or other programmable processor. It will be appreciated that the decision to implement a hardware module mechanically, electrically, in dedicated and permanently configured circuitry, or in temporarily configured circuitry (e.g., configured by software) may be driven by cost and time considerations.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other types of electrical control-devices, such as dimmers and related devices. Consequently, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A control apparatus for color tuning a light-emitting diode (LED) array, the apparatus comprising:
    a correlated color temperature (CCT)-control device configured to be adjusted by an end-user to a desired color temperature of an LED array, the CCT-control device being further configured to produce an output signal corresponding to the desired color temperature;
    a $D_{uv}$-control device configured to be adjusted by an end-user to a desired $D_{uv}$ in which $D_{uv}$ is a distance from a black-body line (BBL) of the LED array, the $D_{uv}$-control device being further configured to produce an output signal corresponding to the desired $D_{uv}$ from the BBL;
    a flux-control device configured to be adjusted by an end-user to a desired luminous-flux value of the LED array, the flux-control device being further configured to produce an output signal corresponding to the desired luminous-flux value; and
    a controller box including an LED driving-circuit to provide current to at least two colors of LEDs in the LED array, the controller box including at least one of an algorithm or a lookup table (LUT) and configured to receive the output signals corresponding to desired color temperature, the desired $D_{uv}$ and the desired luminous-flux value and make a determination as to which of the at least two colors of LEDs is to receive the current based on a monotonic correlation by the at least one of the algorithm or LUT between the output signals from the CCT-control device, the $D_{uv}$-control device, and the flux-control device and the desired color temperature, the desired $D_{uv}$, and the desired luminous-flux value, respectively.

2. The control apparatus of claim 1, wherein the LED array includes at least one LED for each of three selected colors of light in the visible portion of the spectrum.

3. The control apparatus of claim 1, further comprising a multiplexer that includes a plurality of control switches to provide the current to selected ones of LEDs in the LED array, the selection of the LEDs being based on at least a received CCT value of the CCT-output signal.

4. The control apparatus of claim 3, wherein the plurality of control switches is configured to provide periodically, for a predetermined amount of time, current to at least two colors of the LED array, each amount of time and current associated with the at least two colors of the LED array based on the desired color temperature, the desired $D_{uv}$, and the desired luminous-flux value.

5. The control apparatus of claim 1, wherein the LED array is a multi-colored array comprising a plurality of LEDs of different colors.

6. The control apparatus of claim 5, wherein colors of LEDs in the LED multi-colored array include at least one red LED, at least one green LED, and at least one blue LED.

7. The control apparatus of claim 5, wherein the LED multi-colored array comprises at least one desaturated red LED, at least one desaturated green LED, and at least one desaturated blue LED.

8. The control apparatus of claim 1, wherein the LED driving-circuit further comprises a voltage-controlled current source configured to supply current to at least two LEDs in the LED array substantially concurrently.

9. The control apparatus of claim 1, wherein the LED driving-circuit is a hybrid driving-circuit configured to supply a pulse-width modulation (PWM) time slicing signal to selected LEDs within the LED array, the selected LEDs being based at least partially on the desired color temperature.

10. The control apparatus of claim 1, wherein each of the CCT-control device, the $D_{uv}$-control device, and the flux-control device comprises a 0 volt to 10 volt dimmer device.

11. The control apparatus of claim 1, wherein each of the CCT-control device, the $D_{uv}$-control device, and the flux-control device comprises a voltage divider.

12. The control apparatus of claim 1, wherein each of the CCT-control device, the $D_{uv}$-control device, and the flux-control device comprises a channel in a touch screen display.

13. A controllable-lighting apparatus, comprising:
an LED array having at least one desaturated red LED, at least one desaturated green LED, and at least one desaturated blue LED; and
color-tuning and luminous-flux control devices including:
a correlated color temperature (CCT)-control device configured to be adjusted by an end-user to a desired color temperature of the LED array, the CCT-control device being further configured to produce an output signal corresponding to the desired color temperature;
a $D_{uv}$-control device configured to be adjusted by an end-user to a desired $D_{uv}$ in which $D_{uv}$ is a distance from a black-body line (BBL) of the LED array, the $D_{uv}$-control device being further configured to produce an output signal corresponding the desired $D_{uv}$; and
a flux-control device configured to be adjusted by an end-user to a desired luminous-flux value of the LED array, the flux-control device being further configured to produce an output signal corresponding to the desired luminous-flux value,
the desired color temperature, the desired $D_{uv}$, and the desired luminous-flux value provided by the LED array based on a monotonic correlation between the output signals from the CCT-control device, the $D_{uv}$-control device, and the flux-control device and the desired color temperature, the desired $D_{uv}$, and the desired luminous-flux value, respectively determined by at least one of an algorithm or a lookup table (LUT).

14. The controllable-lighting apparatus of claim 13, wherein the desired $D_{uv}$ is configured to adjust an overall color cast of the LED array along an isothermal CCT line corresponding to the desired color temperature.

15. The controllable-lighting apparatus of claim 13, further comprising a controller box including an LED driving-circuit to provide current to at least two of the desaturated red LED, the desaturated green LED, and the desaturated blue LED in the LED array, the controller box configured to receive the output signals corresponding to desired color temperature, the desired $D_{uv}$ and the desired luminous-flux value and make a determination as to which of the at least two colors of LEDs is to receive the current.

16. The controllable-lighting apparatus of claim 13, wherein the LED array has a color-rendering index (CRI) value of greater than about 90.

17. The controllable-lighting apparatus of claim 13, wherein the LED array having the at least one desaturated red LED, the at least one desaturated green LED, and the at least one desaturated blue LED is configured to have a color temperature range of from about 2700 K to about 6500 K.

18. A method to set parameters for a multi-colored LED array, the method comprising:
for each of a correlated color temperature (CCT)-output signal, a $D_{uv}$-output signal, and a flux-output signal:
monotonically correlate, using at least one of an algorithm or a lookup table (LUT), the CCT-output signal, the $D_{uv}$-output signal, and the flux-output signal to a color temperature value, a $D_{uv}$, in which $D_{uv}$ is a distance from a black-body line (BBL) value, and a luminous-flux value, respectively;
send each of the correlated values to a controller for controlling a color temperature and intensity level of the LED array; and
controlling an amount of current delivered to at least two colors of LEDs within the multi-colored LED array.

19. The control apparatus of claim 1, wherein the at least one of the algorithm or LUT are used concurrently such that the algorithm is configured to correlate at least one of the output signals and the LUT is configured to correlate at least another of the output signals.

20. The control apparatus of claim 19, wherein the algorithm is configured to correlate the output signals from the CCT-control device and the $D_{uv}$-control device and the LUT is configured to correlate the output signal from the flux-control device.

* * * * *